United States Patent [19]

Clark et al.

[11] Patent Number: 4,763,030

[45] Date of Patent: Aug. 9, 1988

[54] MAGNETOMECHANICAL ENERGY CONVERSION

[75] Inventors: Arthur E. Clark, Adelphi; Lawrence T. Kabacoff, Silver Spring; Howard T. Savage, Greenbelt; Christine Modzelewski, Columbia, all of Md.

[73] Assignee: The United States of America as represented by the Secretary of the Navy, Washington, D.C.

[21] Appl. No.: 613,835

[22] Filed: May 24, 1984

Related U.S. Application Data

[63] Continuation-in-part of Ser. No. 438,211, Nov. 1, 1982, abandoned.

[51] Int. Cl.⁴ .................................. H01L 41/06
[52] U.S. Cl. .................................. 310/26; 381/176; 381/190; 333/148; 366/127; 73/862.36; 73/862.64; 101/DIG. 5; 148/403; 367/178
[58] Field of Search ............ 148/31.55, 108, 403, 148/304; 75/123 R, 123 B, 123 L; 310/26; 333/148; 366/127; 73/862.36, 862.69, DIG. 2; 179/110 C; 101/DIG. 5

[56] References Cited

U.S. PATENT DOCUMENTS

| | | | |
|---|---|---|---|
| 3,940,992 | 3/1976 | Jost et al. | 73/398 R |
| 4,116,728 | 9/1978 | Becker et al. | 148/108 |
| 4,249,969 | 2/1981 | DeCristofaro et al. | 148/108 |
| 4,268,325 | 5/1981 | O'Handley et al. | 148/108 |
| 4,298,409 | 11/1981 | DeCristofaro et al. | 75/123 B |
| 4,314,594 | 2/1982 | Pfeifer et al. | 148/108 |
| 4,374,665 | 2/1983 | Koon | 73/123 E |
| 4,378,258 | 3/1983 | Clark et al. | 420/435 |
| 4,434,671 | 3/1984 | Yamashita et al. | 73/862.48 |

FOREIGN PATENT DOCUMENTS

| | | | |
|---|---|---|---|
| 107082 | 5/1984 | European Pat. Off. | 73/862.36 |
| 56-33461 | 4/1981 | Japan | 148/108 |

OTHER PUBLICATIONS

Graham et al., "Magnetic Properties of Amorphous Alloys," Metals Technology, Jun. 1980, pp. 244 to 247.
Metallic Glasses, American Society for Metals, 1978, pp. 296-299.
Metallurgy and Magnetism, James Stanley, American Society for Metals, 1949, pp. 31 to 34.
A Dictionary of Metallurgy, A. D. Merriman, MacDonald & Evans et al., p. 176.

Primary Examiner—John P. Sheehan
Attorney, Agent, or Firm—Kenneth E. Walden; Roger D. Johnson

[57] ABSTRACT

A metallic glass ribbon of the formula $$Fe_wB_xSi_yC_z$$

wherein $0.78 \leq w \leq 0.83$, $0.13 \leq x \leq 0.17$, $0.03 \leq y \leq 0.07$, $0.005 \leq z \leq 0.03$, and $$w+x+y+z=1,$$

is annealed to remove mechanical strains and exposed to a magnetic field in the plane of the ribbon and transverse to the long axis of the ribbon. The resulting metalic glass ribbons have very large magnetic coupling coefficients ($k_{33} > 0.9$). The treated ribbons are useful in magnetostrictive transducers and in passive listening devices such as hydrophones or pressure sensors.

24 Claims, 1 Drawing Sheet

MAGNETOMECHANICAL ENERGY CONVERSION

CROSS REFERENCE TO RELATED APPLICATIONS

This application is a continuation-in-part of copending application Ser. No. 438,211 filed on Nov. 1, 1982, now abandoned.

BACKGROUND OF THE INVENTION

This invention relates to magnetostrictive materials and more particularly to magnetostrictive materials prepared from amorphous magnetic alloys.

Both piezoelectric and magnetostrictive materials have been employed in the past as electromechanical transducers for sonar systems. In some applications the same element is used for transmitting and receiving. When the transmitting function is paramount a material capable of delivering high strains is desirable. Here PZT-4 or RFe$_2$ (R=rare earth) materials are important. On the other hand, in many applications the receiving function is paramount, as in the case of listening (or passive) devices. This invention, while applicable to both transmitting and receiving functions, is primarily applicable to passive devices, such as hydrophones and pressure sensors, where saturation strains need not be huge.

The purpose of a hydrophone or pressure sensor is to convert small sound pressure differences into electrical signals. The important figure of merit (F) is:

$$F = s^B k_{33}^2 / (1 - k_{33}^2)$$

Here $s^B$ is the compliance of the material (e.g., the inverse of Young's modulus) at constant magnetic induction. $k_{33}^2$ is the square of the magnetomechanical coupling factor and is the fraction of energy converted to the total energy stored in the mechanical plus electrical systems. The magnetomechanical coupling factor is proportional to the change in magnetostriction with magnetic field ($d\lambda/dH$). As $k_{33}$ exceeds 0.9 and approaches unity, the figure of merit increases very rapidly and approaches infinity.

A class of magnetic materials, amorphous magnetic alloys, with iron as the principal, has been under development for many years in the U.S. and abroad. A method to prepare ribbons of these alloys inexpensively has been developed by companies such as Allied Chemical and General Electric. One of the main motivations is to obtain an inexpensive material with high permeability and high magnetization. An important application is medium power (10 kW) transformers. For this and most common applications, a material with a low or near zero magnetostriction ($\lambda$) is desirable (magnetostriction only causes hum and loss). For the magnetomechanical device, however, a high $d\lambda/dH$ is desirable—generally the higher the better. Magnetostriction is necessary.

Heat treatments with both parallel and perpendicular field orientations have been used to improve the magnetomechanical coupling factors of amorphous metal alloy ribbons. Arai et al (IEEE Trans. on Magnetics MAG-12, 936 (1976)) treated ribbons of Fe$_{80}$P$_{13}$C$_7$ and achieved a coupling factor of 0.53. Tsuya et al (J. Appl. Phys. 49, 1718 (1978)) achieved a coupling factor of 0.75 using Fe$_{78}$Si$_{10}$B$_{12}$. Mitchell et al (IEEE Trans. on Magnetics MAG-4 1169 (1978)) and J. Appl. Phys. 50, 1627 (1979)) obtained coupling factors of 0.81–0.82 from Fe$_{78}$Si$_{10}$B$_{12}$ and Fe$_{71}$Co$_9$B$_{20}$. The highest magnetomechanical coupling factor of 0.85–0.86 was obtained by Brouha and van der Borst from Fe$_{80}$B$_{15}$Si$_5$.

It would be desirable to find materials having still higher magnetomechanical coupling factors which would be used to provide improved sonar devices.

SUMMARY OF THE INVENTION

Accordingly, one object of this invention is to provide a new, improved magnetostrictive material.

Another object of this invention is to provide a new material having an improved magnetomechanical coupling factor.

A further object of this invention is to provide improved magnetostrictive transducer elements having high coupling factors.

Yet another objective of this invention is to provide new improved sonar transmitting and receiving devices.

Yet a further object of this invention is to provide new, improved passive sonar listening devices.

These and other objectives of this invention are achieved by providing a process of preparing a magnetostrictive alloy material by (1) annealing a metallic glass ribbon having the formula Fe$_w$B$_x$Si$_y$C$_z$, wherein $$0.78 \leq w \leq 0.83,$$

$$0.13 \leq x \leq 0.17,$$

$$0.03 \leq y \leq 0.07,$$

$$0.005 \leq z \leq 0.03,$$

and wherein $$w + x + y + z = 1$$

to remove strains in the glass at a temperature ($T_a$) wherein $T_c - 20°\text{C}. \leq T_a < T_x$, wherein $T_c$ represents the Curie temperature of the alloy and $T_x$ represents the crystallization temperature of the alloy; and (2) applying a magnetic field which is in the plane of the ribbon and which is transverse to the long axis of the ribbon, during the annealing step, a subsequent cooling down of the alloy, or both, the magnetic field having a strength sufficient to build in a small transverse anisotropy.

These treated metallic glass ribbons are useful for the conversion of mechanical energy into magnetic energy or for the conversion of magnetic energy into mechanical energy (transducers). These treated ribbons are particularly useful for converting small pressure changes into changes in magnetic field (hydrophones, pressure sensors).

DETAILED DESCRIPTION OF THE PREFERRED EMBODIMENT

Figure 3:
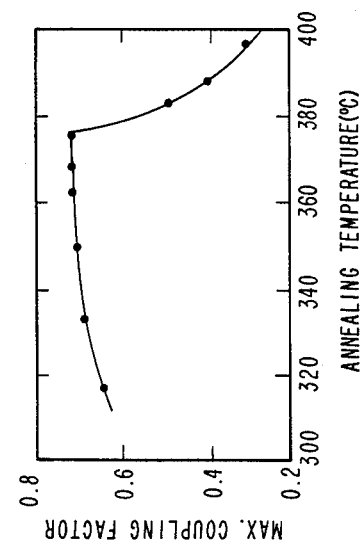
FIGS. 1–4 are graphs illustrating magnetic properties of the various materials tested. These figures are discussed in more detail in the example.

A ribbon of metallic glass comprising:

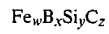

wherein $$0.78 \leq w \leq 0.83,$$

$$0.13 \leq x \leq 0.17,$$

$$0.03 \leq y \leq 0.07,$$

$$0.005 \leq z \leq 0.03,$$

and $$w+x+y+z=1.00$$

is annealed at a temperature from about 20° C. below its Curie temperature ($T_c$) up to just below its crystallization temperature ($T_x$) until the mechanic strains caused during the formation of the metallic glass are removed. A magnetic field in the plane of the ribbon and transverse (at 90°) to the long axis of the ribbon is concurrently applied and continued while the ribbon is cooled. The process produces a nearly strain-free magnetostrictive metallic glass ribbon having a striped domain pattern with an easy magnetic axis in the plane of the ribbon and traverse (at 90°) to the long axis of the ribbon. The ribbons produced by this process have very high coupling coefficients.

The starting metallic glass ribbons used in this invention can be produced by conventional methods. For example, the McGraw-Hill Encyclopedia of Science and Technology (McGraw-Hill 1982), volume 8, p. 410 describes one method as follows: "the principle of this method is to feed a continuous jet of liquid alloy on the outside rim of a rapidly rotating cylinder. The molten alloy solidifies rapidly into a thin ribbon (about 50 μm thick) which is ejected tangentially to the rotating cylinder at rates as high as 2000 m/min." The article further explains that the rate of cooling for the alloys is from $10^6$ to $10^8$°C./Sec. Moreover, by using multiple jets, wider strips can be produced. Metallic glasses are also commerically available from companies such as Allied Chemical and General Electric.

Strains are produced in the metallic glass ribbons at the time they are formed by the rapid cooling of the alloys. These strains must be removed by annealing the metallic glass strip prior or during the magnetizing step. The strains relax during the magnetization process causing movement of atoms and the desired orientation of anisotropic axes.

The metallic glass strips are annealed at a temperature in the range of from about 20° C. below the Curie temperature ($T_c$) up to a temperature just below the crystallization temperature ($T_x$). Note that the Curie temperature of a magnetic material will vary with (1) the composition of the material and (2) the metallurgical history of the material. Thus, it is not possible to assign a single value or values to cover all materials. However, the Curie temperature is a common property of magnetic materials and conventional techniques may be used to determine it. Another restriction is that the metallic glass must be annealed below its crystallization temperature. This is done to prevent the formation of crystals in the glass which result in poorer magnetic properties. Usually an annealing of a few minutes is sufficient to eliminate these strains and build in a suitable anisotropy. near the crystallization temperature an even shorter time may be sufficient.

While the strain-free metallic glass is still at the annealing temperature the magnetizing field is applied. This field lies in the plane of the ribbon and is traverse to its the length (at 90° to the long axis). A field strenght preferably of from about 100 $O_e$ to about 10 $kO_e$, but more preferably from 1 $kO_e$ to 6 $kO_e$, is used. Stronger fields may also be used, but there is no advantage in doing so. This magnetic field is frequently maintained as the metallic glass strip is cooled to room temperature. While that is the preferred procedure, several variations are also possible. For example, the magnetic field can be removed at a temperature higher than room temperature (e.g., ~100° C.). Also at annealing temperatures near or below the Curie temperature, it is possible to apply the magnetic field during the annealing and then remove it before the cooling step.

One critical factor in this invention is the composition of the metallic glass used. In the general formula

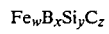
$$Fe_wB_xSi_yC_z$$

w represents the atomic fraction of iron, the dominant component in the metallic glass. Broadly, $0.78 \leq w \leq 0.83$ but preferably $0.79 \leq w \leq 0.82$.

For x, the atomic fraction of boron, $0.13 \leq x \leq 0.17$ but preferably $0.135 \leq x \leq 0.15$.

For y, the atomic fraction of silicon, $0.03 \leq y \leq 0.07$ but preferably $0.03 \leq y \leq 0.06$.

For z, the atomic fraction of carbon, $0.005 \leq z \leq 0.03$ but preferably $0.01 \leq z \leq 0.02$.

Finally, $w+x+y+z=1$, with allowance for minor amounts of non-interferring impurities or additives.

The materials of this invention are distinguishable from the commerically available metallic glasses of the same chemical composition in that the present compounds are strain-free and have built-in easy magnetic axes which are in the plane of the glass ribbon and transverse to the long axis of the ribbon.

These treated metallic glass ribbons may be used to convert mechanical energy into magnetic energy and to convert magnetic energy into mechanical energy. For example, the ribbons may be used as the magnetostrictive elements in magnetostrictive transducers. Moreover, because of their high magnetostrictive coupling coefficients ($K_{33}$), these ribbons will be particularly useful as magnetostrictive elements in passive devices such as hydrophones or pressure sensors where small changes in pressure are converted into changes in magnetic field which induce electric currents in sensing coils.

The magnetostrictive axis for one of these treated metal glass ribbons is along the long axis of the ribbon. Accordingly, when magnetic (or electrical) energy is converted into mechanical energy, the drive coil may be wound around the ribbon transverse to the long axis. Similarly, when mechanical energy is converted into magnetic energy, a sensing coil, wound around the ribbon transverse to the long axis or placed adjacent to the ribbon, may be used to measure the change in magnetization.

The general nature of the invention having been set forth, the following example is presented as a specific illustration thereof. It will be understood that the invention is not limited to this specific example but is susceptible to various modifications that will be recognized by one of ordinary skill in the art.

Note: METGLAS is a registered trademark of the Allied Chemical Corporation.

EXAMPLE 1

3″×1/16″×0.001″ strips of Metglas® 2605 CO ($Fe_{67}Co_{18}B_{14}Si_1$) and Metglas® 2605 SC ($Fe_{81}B_{13.5}Si_{3.5}C_2$) were annealed for 10 minutes in the presence of a magnetic field. The field lay in the plane of the ribbon and was transverse to its length. The annealing temperatures, $T_a$, were varied from 280° C. to 430° C. The annealing field, $H_a$, was varied from 25 to 6100 Oe. The magnetomechanical coupling factor, $k_{33}$, of each sample was measured as a function of longitudinal bias field using a resonance technique in which the complex susceptibility is measured as a function of frequency. $k_{33}$ was then calculated from the resonance and antiresonance frequencies. These measurements and calculations were made according to the methods disclosed by Mitchell et al, J. Appl. Phys. 50, p. 7594 (1979) and H. T. Savage et al, IEEE Transactions on Magnetics, MAG-11, 1355 (1975), herein incorporated by reference. The actual methods used in making these measurements and calculations are not critical factors in this invention. The susceptibility was also used to plot impedance and admittance circles and to calculate Q values. It was also necessary to plot impedance circles to insure the absence of spurious modes which were detected by extra loops on the impedance circle. Excitation of spurious modes was an intermittent problem. Squirting alcohol in the sample holder with a squeeze bottle eliminated the problem in some cases. The magnetization was measured using the same apparatus, except that the voltage from the pick-up coil was fed into an integrating operational amplifier instead of a network analyzer. All measurements were controlled by a minicomputer. In particular, the measurement of magnetization versus field for each sample was accomplished in $\sim 1$ sec. The high speed was necessary to reduce drift in the integrating operational amplifier used in the measurement.

The Metglas® 2605 CO sample is included to demonstrate that the inclusion of cobalt greatly lowers $k_{33}$ (i.e., 0.71) below the results of Brouha et al (0.85–0.86). By way of contrast, our Metglas® 2605 SC samples containing iron, boron, silicon and carbon but not cobalt, gave substantially better results ($k_{33}=0.93+$) than Brouha et al.

Figure of merit calculations for the material more dramatically demonstrate this improvement. Brouha et al ($k_{33}=0.86$) has a figure of merit of $$F=s^B(0.86)^2/(1-(0.86)^2)=2.84s^B$$

whereas the figure of merit for our Metglas® 2605 SC sample is $$F=s^B(0.93)^2/(1-(0.93)^2)=6.40s^B$$

wherein $s^B \approx 7 \times 10^{-12}$ m²/N.

Results for Treated Metglas®$_{Ribbon}$2605 CO ($Fe_{67}CO_{18}B_{14}Si_1$)

Figure 1:
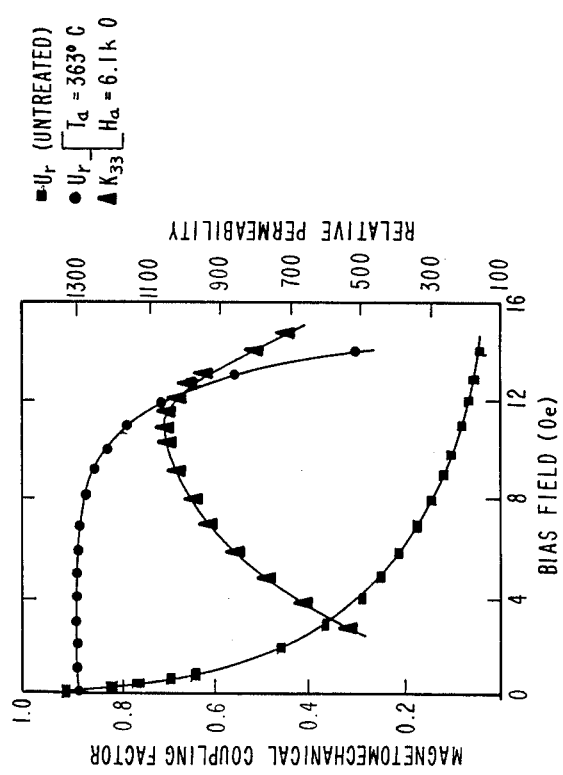

FIG. 1 shows a plot of magnetomechanical coupling factor, $k_{33}$ (solid triangles), and relative a.c. permeability, $\mu_r$ (solid circles), as a function of longitudinal bias field for a sample annealed at 363° C. in a transverse field of 6.1 k Oe. For comparison, $\mu_r$ (solid squares) for an unannealed ribbon is also shown. Because of uncertainty in the filling factor, a scale factor for the $\mu_r$ data was estimated. As may be seen from the FIG. 1, $\mu_r$ is constant up to $H_{bias} \sim 6$ Oe, falling rapidly above the field. $k_{33}$, on the other hand, has a maximum, $k_{max}$, of 0.71 at a bias of $\sim 10.5$ Oe. At this field, the moment is large, but $\mu_r$ is also still large. Identical numbers were obtained for all samples annealed between 360° and 375° C. in fields greater than 1 k Oe for the CO ribbon.

Figure 2:
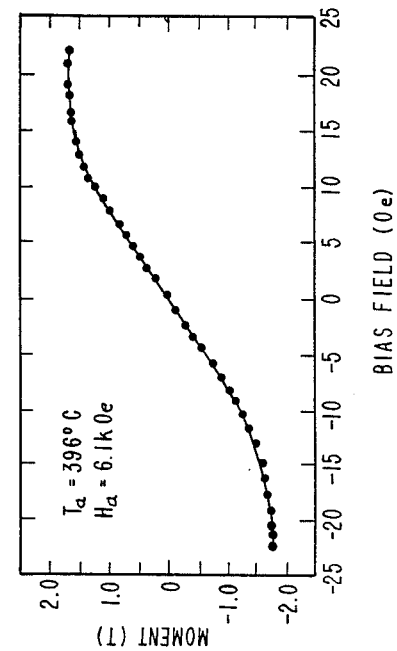

FIG. 2 shows the magnetization curve for Metglas® 2605 CO ribbon for which $T_a = 369°$ C. and $H_a = 6.1$ k Oe. The curve is typical of those for samples annealed in the temperature range $360° C. \leq T_a \leq 375°$ C. The striking feature of the magnetization and permeability curves is that, below saturation, the data can be described (to within experimental error) as a pure rotation of the moment. The data from the magnetization curve could be used to determine the filling factor for the coil if we assume a saturation magnetization of 1.75 T as supplied by the manufacturer. From this the low field permeability, $\mu_r$, was calculated to be about 1300.

FIG. 3 shows that below $T_a = 360°$ C., $k_{max}$ falls slowly with decreasing annealing temperature, while for $T_a$ about 375° C., $k_{max}$ falls off very rapidly. X-ray spectra of samples annealed above 375° C. indicate that decrease in $k_{max}$ is due to crystallization. For samples annealed at $360° \leq T_2 \leq 375°$ C., $k_{max}$ was constant for $H_a \geq 1$ k Oe. Below 1 k Oe, $k_{max}$ falls off rapidly with decreasing $H_a$.

Results for Treated Metglas® 2605 SC ($Fe_{81}B_{13.5}Si_{3.5}C_2$).

The coupling factors are much larger in the SC ribbon than in the CO ribbon. In Table I are listed the coupling factors of an SC sample annealed at 389° C. for various bias fields. Values of $k_{33}$ have been calculated from $$k_{33}^2 \approx (\pi^2/8)(1-f_r^2/f_a^2)$$

as done by H. T. Savage et al, IEEE Transactions on Magnetics MAG-14, 545 (1978).

TABLE I

| Field (Oe) | $k_{33}$ | $f_a$ (kHz) | $f_r$ (kHz) |
|---|---|---|---|
| .18 | .79 | 31.76 | 22.29 |
| .28 | .86 | 31.52 | 20.03 |
| .37 | .90 | 30.94 | 17.97 |
| .46 | .93 | 30.30 | 16.61 |
| .55 | .95 | 29.65 | 15.50 |
| .64 | .96 | 29.05 | 14.63 |
| .74 | .96 | 28.55 | 14.15 |
| .83 | .96 | 28.17 | 14.06 |
| .92 | .92 | 28.78 | 16.05 |
| 1.0 | .85 | 29.99 | 19.33 |
| 1.1 | .78 | 30.86 | 21.90 |
| 1.2 | .75 | 31.48 | 23.25 |
| 1.3 | .70 | 31.77 | 24.70 |

Coupling factor, $k_{33}$, antiresonance frequency, $f_a$, and resonance frequency, $f_r$, as a function of field for a 76.2 mm long SC ribbon.

Figure 4:
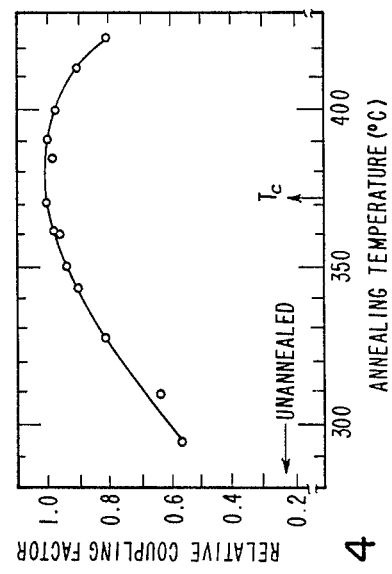

$f_a$ and $f_r$ are the lowest order antiresonance and resonance frequencies. The values are extremely large, far larger than previously reported values. Note that the maximum coupling is at an order of magnitude lower field in the SC ribbon than in the CO ribbon. Values of the relative maximum coupling factor, $k_{max}(T_a)/k_{max}(389°)$, versus annealing temperature, $T_a$, are shown in FIG. 4. The largest values are obtained when annealing close to the Curie point.

Obviously, numerous modifications and variations of the present invention are possible in light of the above teachings. It is therefore to be understood that within the scope of the appended claims the invention may be practiced otherwise than as specifically described herein.

What is claimed is:

1. A magnetostrictive transducer comprising:
   (1) a magnetostrictive transducer element comprising a metallic glass ribbon of the composition $Fe_wB_xSi_yC_z$ wherein $0.78 \leq w \leq 0.83$, $0.13 \leq x \leq 0.17$, $0.03 \leq y \leq 0.07$, $0.005 \leq z \leq 0.03$, and $w+x+y+z=1.00$ wherein the metallic glass ribbon is essentially strain free, has a weak axis of magnetization which is in the plane of the ribbon transverse (at 90°) to the long axis of the ribbon, and has a magnetomechanical coupling factor ($K_{33}$ greater than or equal to 0.90; and
   (2) means for generating a change in magnetic field in the transducer element.

2. The transducer of claim 1 wherein $0.79 \leq w \leq 0.82$.
3. The transducer of claim 1 wherein $0.135 \leq x \leq 0.15$.
4. The transducer of claim 1 wherein $0.03 \leq y \leq 0.06$.
5. The transducer of claim 1 wherein $0.01 \leq z \leq 0.02$.
6. A pressure sensor which converts mechanical energy in the form of a change in pressure into magnetic energy in the form of a change in magnetic field, the sensor comprising:
   (1) a magnetostrictive pressure sensing element comprising: a metallic glass ribbon of the composition $Fe_wB_xSi_yC_z$ wherein $0.78 \leq w \leq 0.83$, $0.13 \leq x \leq 0.17$, $0.03 \leq y \leq 0.07$, $0.005 \leq z \leq 0.03$, and $w+x+y+z=1.00$ wherein the metallic glass ribbon is essentially strain free, has a weak axis of magnetization which is in the plane of the ribbon transverse (at 90°) to the long axis of the ribbon and has a magnetomechanical coupling factor ($K_{33}$) greater than or equal to 0.90; and
   (2) means for detecting changes in magnetic field in the pressure sensing element.

7. The pressure sensor of claim 6 wherein $0.79 \leq w \leq 0.82$.
8. The pressure sensor of claim 6 wherein $0.135 \leq x \leq 0.15$.
9. The pressure sensor of claim 6 wherein $0.03 \leq y \leq 0.06$.
10. The pressure sensor of claim 6 wherein $0.01 \leq z \leq 0.02$.

11. A method of converting mechanical energy into magnetic energy comprising subjecting a material comprising a metallic glass ribbon of the composition $Fe_wB_xSi_yC_z$ wherein $0.78 \leq w \leq 0.83$, $0.13 \leq x \leq 0.17$, $0.03 \leq y \leq 0.07$, $0.005 \leq z \leq 0.03$, and $w+x+y+z=1.00$ wherein the metallic glass ribbon is essentially strain free, has a weak axis of magnetization which is in the plane of the ribbon transverse (at 90°) to the long axis of the ribbon, and has a magnetomechanical coupling factor ($K_{33}$) greater than or equal to 0.90 to a change in pressure.

12. The method of claim 11 wherein $0.79 \leq w \leq 0.82$.
13. The method of claim 11 wherein $0.135 \leq x \leq 0.15$.
14. The method of claim 11 wherein $0.03 \leq y \leq 0.06$.
15. The method of claim 11 wherein $0.01 \leq z \leq 0.02$.
16. A method of converting magnetic energy into mechanical energy wherein said mechanical energy is in the form of a change of dimension in material comprising subjecting a material comprising a metallic glass ribbon of the composition $Fe_wB_xSi_yC_z$ wherein $0.78 \leq w \leq 0.83$, $0.13 \leq x \leq 0.17$, $0.03 \leq y \leq 0.07$, $0.005 \leq z \leq 0.03$, and $w+x+y+z=1.00$ wherein the metallic glass ribbon is essentially strain free, has a weak axis of magnetization which is in the plane of the ribbon transverse (at 90°) to the long axis of the ribbon, and has a magnetomechanical coupling factor ($K_{33}$) and greater than or equal to 0.90 to a change in magnetic field.

17. The method of claim 16 wherein $0.79 \leq w \leq 0.82$.
18. The method of claim 16 wherein $0.135 \leq x \leq 0.15$.
19. The method of claim 16 wherein $0.03 \leq y \leq 0.06$.
20. The method of claim 16 wherein $0.01 \leq z \leq 0.02$.
21. The transducer of claim 1 wherein the magnetomechanical coupling factor is greater than or equal to 0.93.
22. The pressure sensor of claim 6 wherein the magnetomechanical coupling factor is greater than or equal to 0.93.
23. The method of claim 11 wherein the magnetomechanical coupling factor is greater than or equal to 0.93.
24. The method of claim 16 wherein the magnetomechanical coupling factor is greater than or equal to 0.93.

* * * * *